(12) United States Patent
Tandou et al.

(10) Patent No.: US 10,103,007 B2
(45) Date of Patent: Oct. 16, 2018

(54) PLASMA PROCESSING APPARATUS WITH GAS FEED AND EVACUATION CONDUIT

(71) Applicant: Hitachi High-Technologies Corporation, Minato-ku, Tokyo (JP)

(72) Inventors: Takumi Tandou, Tokyo (JP); Akitaka Makino, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 388 days.

(21) Appl. No.: 14/626,952

(22) Filed: Feb. 20, 2015

(65) Prior Publication Data
US 2016/0064189 A1 Mar. 3, 2016

(30) Foreign Application Priority Data
Aug. 26, 2014 (JP) .................................. 2014-171087

(51) Int. Cl.
*H01L 21/683* (2006.01)
*H01J 37/32* (2006.01)

(52) U.S. Cl.
CPC .... *H01J 37/3244* (2013.01); *H01J 37/32192* (2013.01); *H01J 37/32678* (2013.01); *H01L 21/6831* (2013.01)

(58) Field of Classification Search
CPC ............ C23C 16/45561; C23C 16/466; H01J 37/3244; H01J 37/32678; H01J 37/32192; H01J 37/32715; H01L 21/6833; H01L 21/6831
See application file for complete search history.

(56) References Cited

U.S. PATENT DOCUMENTS

| 5,856,906 A * | 1/1999 | Kholodenko | ..... H01L 21/67109 279/128 |
| 6,133,148 A * | 10/2000 | Won | ................... C23C 16/45557 257/E21.17 |
| 6,610,171 B2 * | 8/2003 | Tamura | ............. H01L 21/67109 118/500 |
| 8,828,257 B2 | 9/2014 | Kitada et al. | |

(Continued)

FOREIGN PATENT DOCUMENTS

| JP | 2010-153678 A | 7/2010 |
| JP | 2010-267708 A | 11/2010 |

*Primary Examiner* — Rakesh K Dhingra
*Assistant Examiner* — Laureen Chan
(74) *Attorney, Agent, or Firm* — Miles & Stockbridge P.C.

(57) ABSTRACT

A sample stage includes plural pushup pins that move a sample up/down above the stage, a recessed and protruding dielectric film on which the sample is loaded, a feeding port disposed on the film and through which gas is fed to a gap between the sample and the film, and openings of through-holes in which the pushup pins are housed, and the stage is connected to a feeding and evacuation conduit including a feeding path that communicates with the port and through which gas fed to the gap flows, an evacuation path that communicates with the opening and through which gas fed to the gap is discharged, and a connection path through which the feeding path and the evacuation path communicate. With communication between the feeding path and the evacuation path via the connection path interrupted, gas from the feeding path is fed to the gap and into the through-hole via the gap.

8 Claims, 6 Drawing Sheets

(56) References Cited

U.S. PATENT DOCUMENTS

2005/0051520 A1* 3/2005 Tanaka ............... H01J 37/3244
                                                    219/121.43
2012/0211486 A1* 8/2012 Kasai ............... H01L 21/67017
                                                    219/679

* cited by examiner

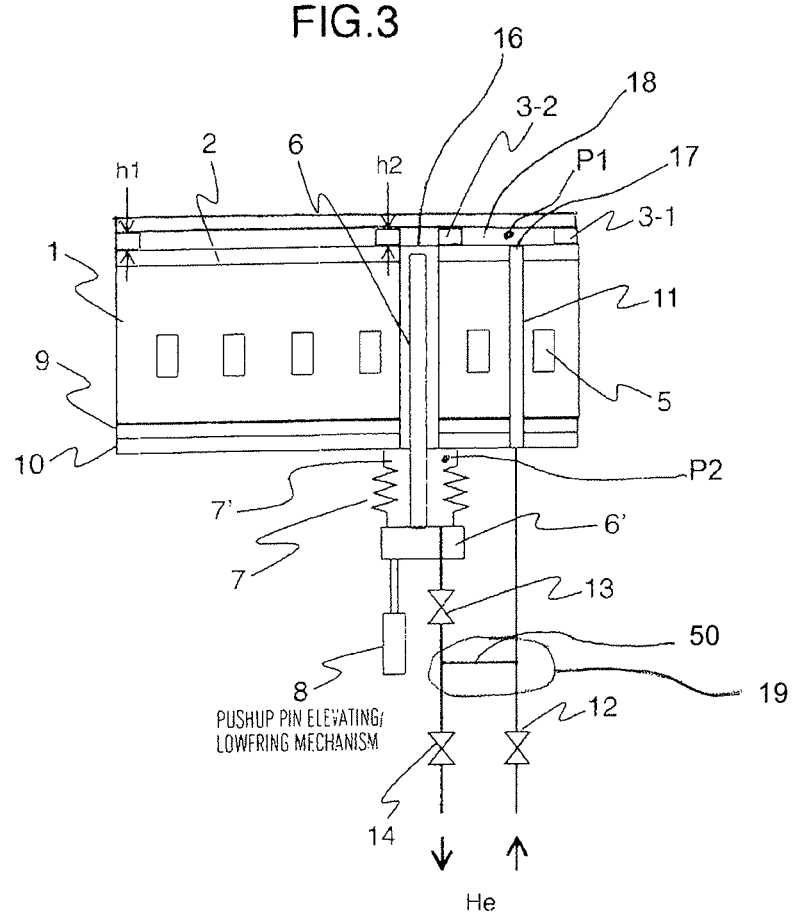

PLASMA PROCESSING APPARATUS WITH GAS FEED AND EVACUATION CONDUIT

BACKGROUND OF THE INVENTION

The present invention relates to a processing apparatus that executes processing such as etching on a film structure pre-disposed on an upper surface of a substrate-like sample such as a wafer in steps of manufacturing a semiconductor device, and in particular, to a plasma processing apparatus that processes a wafer loaded and held on an upper surface of a sample stage disposed in a processing chamber inside a vacuum container, using plasma formed in the processing chamber.

With a trend to miniaturize semiconductor devices, processing accuracy has been increasing year by year which is needed for a process in which interconnects are formed by executing processing such as etching on a film structure disposed on an upper surface of a substrate-like sample such as a semiconductor wafer. To accurately perform etching using a plasma processing apparatus based on a pattern on a wafer surface, appropriately managing the temperature of a surface of a wafer during etching is important.

In recent years, there has been a demand for a technique for more quickly and precisely regulating the temperature of a wafer in each of a plurality of steps of a process for processing a wafer, in order to meet a demand for further improvement of shape accuracy. In order to control the surface temperature of a wafer in a plasma processing apparatus with the internal pressure thereof reduced to a high degree of vacuum, the following measure is conventionally taken. That is, a thermoconductive medium is introduced between a back surface of the wafer and an upper surface of a sample with the wafer loaded thereon. Thus, via the thermoconductive medium, the efficiency at which heat is transferred to the sample stage is improved and the temperature of the upper surface of the sample stage or the sample is regulated.

A general configuration of such a sample stage is such that a member defining a loading surface for a circular wafer disposed on the upper surface of the cylindrical sample stage provides the function of an electrostatic chuck. Specifically, the sample stage has a function to attract by an electrostatic force and hold a wafer loaded on the upper surface of the sample stage, on the upper surface of a film (attractive film) of a dielectric material defining the loading surface. Moreover, the sample stage allows a fluid such as He gas which promotes heat transfer to be fed to between a front surface of the loading surface and the back surface of the wafer, as a thermoconductive medium, to improve the efficiency of heat transfer between the sample stage and the wafer in the vacuum container.

Furthermore, in order to deliver and receive a wafer to and from a conveying robot that conveys the wafer from the outside of the plasma processing apparatus or unloads the wafer from the plasma processing apparatus, such a sample stage includes an arrangement that is lifted up above the loading surface of the sample stage or lowered to load the wafer onto the loading surface. As a typical such an arrangement, a plurality of pins are known which move up and down relative to the sample stage so that tips of the pins move up and down from the inside of the loading surface of the sample stage to a particular height above the upper surface. Such pins move up, and a wafer is loaded on the tips of the pins. The pins further move up above the loading surface. In this state, a wafer holding section disposed at a tip of an arm of a wafer conveying robot enters a gap formed between the back surface of the wafer and the loading surface. The wafer is then transferred from the tips of the pins onto the holding section and carried out from the plasma processing apparatus. Furthermore, in contrast, with the wafer held on the wafer holding section, the arm enters the inside of the vacuum container of the plasma processing apparatus to move the wafer on the holding section to above the tips of the pins. The wafer is transferred onto the tips of pins, and then, the arm moves out from the vacuum container.

In general, at least a particular plural number (for example, three) of such pins are housed inside through-holes that are in communication with openings positioned in the upper surface of the circular loading surface of the sample stage. The openings or the through-holes are positioned at a predetermined distance from one another around the center of the loading surface. However, the above-described arrangement for electrostatic attraction fails to be disposed inside the through-hole or opening in which each of the pins is disposed. This precludes the position where the pin is disposed from providing the function of an electrostatic attraction in the loading surface of the sample stage. At the position where the pin is disposed, the performance of heat transfer between the sample stage and the wafer may be degraded. Thus, not only may the temperature at a position of the wafer located above and corresponding to the position where the pin is disposed differs significantly from the temperature in a peripheral area but also the position where the pin is disposed may be a singularity on a temperature distribution where regulating the temperature to a desired value is difficult.

To solve such a problem, a configuration has been contemplated in which heat transfer gas such as He which is equivalent to the gas fed to between the back surface of the wafer and the upper surface of the dielectric film is fed into the through-hole or any other hole in which the pin is housed and in which the pressure of the gas with which the hole with the pin housed therein is filled is regulated to be higher than the pressure of the heat transfer gas between the wafer and the electrostatically attractive surface of the dielectric film, as in JP-A-2010-267708. This related art suppresses a decrease in the amount of heat transfer even at the position of the wafer located above and corresponding to the pin hole, thus restraining the uniformity of the in-plane-wise temperature of the wafer from being impaired.

On the other hand, the configuration in JP-A-2010-267708 includes an arrangement in which the seal between a side surface of the pin and an inner wall surface of the hole with the pin housed therein serves as an air-tight seal between the processing chamber side in the vacuum container and the inside of the sample stage. Thus, when the pins, housed in the through-hole and in the sample stage, moves up to press the tips of the pins against the back surface of the wafer to lift the wafer up above the loading surface, the pins may be damaged or the seal may be broken due to the electrostatically chucking force remaining between the wafer and the loading surface. Then, the inside of the processing chamber may fail to be maintained at the degree of vacuum suitable for processing.

To solve such a problem, JP-A-2010-153678 discloses a configuration in which each pin is peripherally enclosed and covered by a telescopic bellows below the through-hole with the pin housed therein to enable vacuum to be maintained even when the above-described damage or seal breakage may occur. JP-A-2010-153678 (corresponding to U.S. Pat. No. 8,828,257) is configured such that heat transfer gas is fed into the bellows and thus into the gap between the back surface of the wafer and the front surface of the sample stage via the hole with the pin housed therein. JP-A-2010-153678 also discloses a configuration in which the heat transfer gas is fed while the wafer is not loaded on the electrostatically attractive surface of the sample stage to suppress the entry of foreign matter into the bellows.

SUMMARY OF THE INVENTION

In the above-described related art, insufficient considerations have been made for points described below, leading to problems.

That is, in the configuration in JP-A-2010-153678, the heat transfer gas is fed through the pushup pin hole. Thus, if foreign matter is collected in the pushup pin hole or the bellows during processing of a large number of wafers, the foreign matter flies up and adheres to the back surface of the wafer due to the feeding of the heat transfer gas. The foreign matter adhering to the back surface of the wafer flies throughout the etching apparatus via a hand of the conveying robot and the like. When the foreign matter falls onto a fine pattern formed on the upper surface of the wafer by plasma processing, a semiconductor device with interconnects corresponding to a portion of the fine pattern onto which the foreign matter has fallen becomes unusable or has degraded performance. This leads to reduced productivity (yield).

Moreover, in the structure using the bellows as JP-A-2010-153678, the volume of the bellows is generally larger than the volume of the gap between the back surface of the wafer and the loading surface which is filled with the heat transfer gas such as He. However, since the wafer is carried out from the processing chamber after the steps of plasma processing end, when the wafer is lifted up above the loading surface of the sample stage, the He gas needs to be evacuated through the gap. However, a time needed for this evacuation is dominated by a time needed to evacuate the gas present inside the bellows, which is thus what is called a rate limiting factor.

That is, the amount of gas evacuated from the space inside the bellows needs to be increased to complete the evacuation in a short time in order to increase the number of wafers processed per unit time (what is called throughput) to improve the efficiency of processing by the apparatus. However, the related art does not take into account means for solving such problems. Thus, in the configuration in which the pin allowing the wafer to be lifted from the loading surface is externally peripherally enclosed by the bellows, it has been desirable to allow gas inside the through-hole with the pin disposed therein and inside the bellows to be evacuated at a high speed and to prevent foreign matter that may adhere to the wafer from being generated inside the through-hole when the heat transfer gas such as He is fed or discharged.

An object of the present invention is to provide a plasma processing apparatus that enables processing efficiency to be improved. Another object of the present invention is to provide a plasma processing apparatus with improved processing yield.

Thus, embodiments can include a plasma processing apparatus that uses plasma generated in a processing chamber in a vacuum container to process a sample electrostatically attracted onto a sample stage disposed in the processing chamber, in which the sample stage includes a plurality of pushup pins that move the sample up and down above the sample stage, a recessed and protruding dielectric film on which the sample is loaded, a feeding port disposed on the dielectric film and through which gas is fed to a gap between the sample and the dielectric film, a plurality of through-holes in each of which each of the plurality of pushup pins are housed, each of the plurality of through-holes having openings wherein each opening is disposed in an upper surface of the dielectric film, a plurality of bellows each of which is disposed below the sample stage and surrounding a lower portion of each of the pushup pins to separate an internal space including each of the pushup pins and the through-hole from an outside in an air-tight manner, and a feeding and evacuation conduit which is connected to the sample stage, the feeding and evacuation conduit comprising a feeding path, and an evacuation path and a bypass conduit, wherein the feeding path communicates with the feeding port for the gas and a gas source and through which the gas fed to the gap flows, wherein the evacuation path communicates with a space inside the bellows and through which the gas fed to the gap is discharged, wherein the feeding path and the evacuation path communicate through the gap which provides a connection path, and an upstream valve disposed on the evacuation path between the space inside the bellows and an intersection portion of the evacuation path and the bypass conduit which connects the evacuation path with the feeding path at a lower portion of the sample stage, in which the plasma processing apparatus is configured to close the upstream valve such that communication between the feeding path and the evacuation path via the connection path is interrupted while the gas from the feeding path is fed to the gap and into the through-hole via the gap.

He can be fed into pushup pin hole, and the He in the pushup pin hole can be evacuated at a high speed. Moreover, during feeding and evacuation of He, a flow of He gas can be held in "a gap under a back surface of a wafer and the pushup pin hole", in that order. This enables prevention of flying of foreign matter in the pushup pin hole caused by backflow of the He gas. This enables (1) an increase in evacuation speed at the end of a process (at the time of back surface He evacuation), (2) prevention of possible temperature singularities during the process (during back surface He feeding), and (3) prevention of flying-out of foreign matter through the pushup pin hole.

Other objects, features and advantages of the invention will become apparent from the following description of the embodiments of the invention taken in conjunction with the accompanying drawings.

BRIEF DESCRIPTION OF THE DRAWING

FIG. 3 is a vertical cross-sectional view schematically depicting a main part of a configuration of a sample stage in a plasma processing apparatus according to a variation of the embodiment depicted in FIG. 1;

DETAILED DESCRIPTION OF THE INVENTION

An embodiment of the present invention will be described below using the drawings.

Embodiment 1

Figure 1:
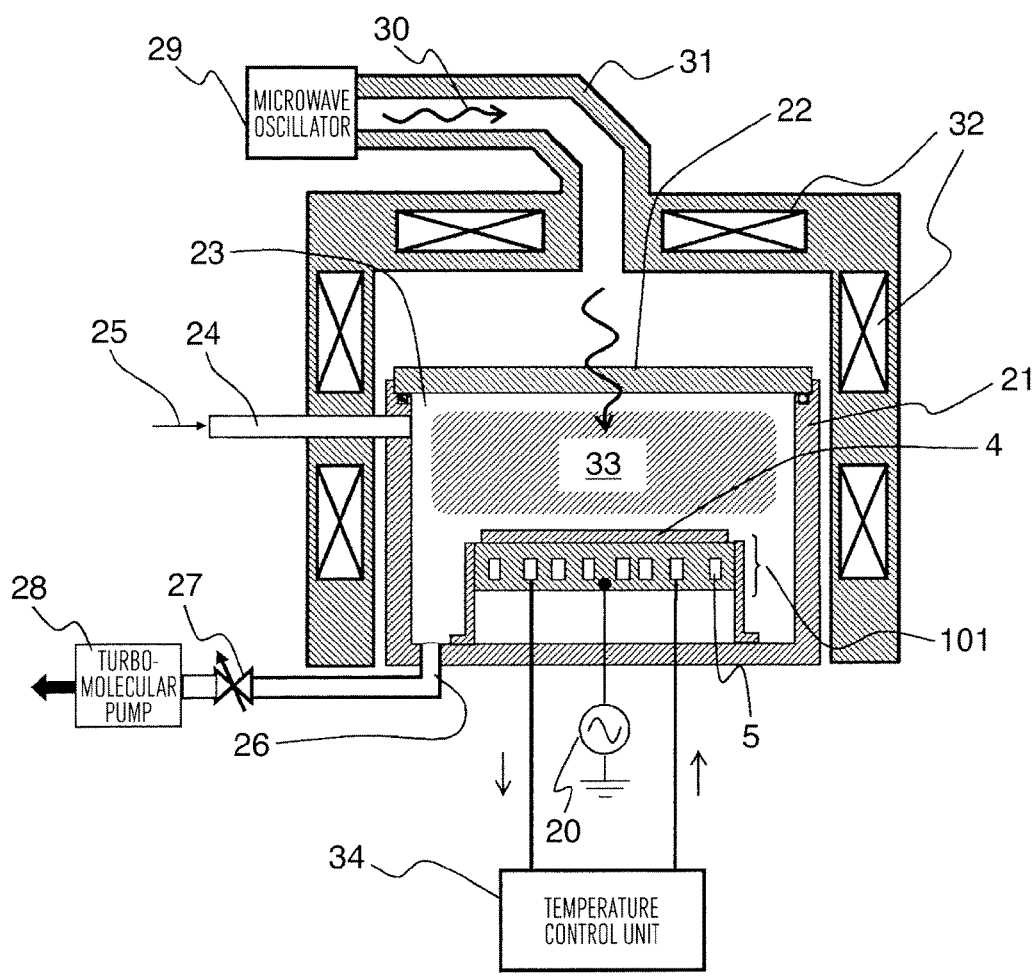
FIG. 1 is a vertical cross-sectional view schematically depicting a configuration of a plasma processing apparatus according to an embodiment of the present invention.

The embodiment of the present invention will be described below using FIG. 1 and FIG. 2. FIG. 1 is a vertical cross-sectional view schematically depicting a configuration of a plasma processing apparatus according to the embodiment of the present invention. In particular, FIG. 1 depicts an apparatus that supplies a processing chamber inside a vacuum container with a microwave electric field that forms plasma and a magnetic field that interacts with the electric field, to etch a film structure in an upper surface of a sample such as a semiconductor wafer using electron cyclotron resonance (ECR).

The plasma processing apparatus according to the present embodiment roughly includes a vacuum container 21 with a processing chamber 23 in which plasma is formed, a plasma forming section disposed above the vacuum container 21 to form an electric field or a magnetic field that allows plasma to be formed in the processing chamber 23, and an evacuation section with a vacuum pump such as a turbo-molecular pump disposed below the vacuum container 21 and communicating with the processing chamber 23 to evacuate gas from an inner space in the processing chamber 23 to reduce the pressure in the inner space. The processing chamber 23 is a cylindrical space, and the vacuum container 21 externally peripherally enclosing the processing chamber 23 has a metallic cylindrical portion.

A window member 22 is disposed at the top of a cylindrical sidewall of the vacuum container 21. The window member 22 is loaded on an upper end of the sidewall, shaped like a disk, and formed of quartz, through which the microwave electric field can pass. A seal member such as an O ring is sandwiched and held between an upper end of the sidewall and a lower surface of an outer peripheral edge of the window member 22 to create an air-tight seal between the inside of the processing chamber 23 and an external space set at the atmospheric pressure. The window member 22 provides the vacuum container 21. Furthermore, a cylindrical sample stage 101 is provided in an internally lower portion of the processing chamber 23. A circular loading surface on which a substrate-like sample 4 such as a disk-shaped semiconductor wafer is loaded is provided on the upper surface of the sample stage 101.

A gas introduction pipe 24 is connected to an upper portion of the sidewall of the vacuum container 21 to introduce processing gas 25 flowing through the gas introduction pipe 24 into the processing chamber 23 through a gas introduction hole positioned in a lower portion of the window member 22. The processing gas 25 introduced into the processing chamber 23 is excited by interaction between the electric field and magnetic field fed into the processing chamber 23, thus forming plasma 33.

An evacuation port 26 is disposed at the bottom of the processing chamber 23 below the sample stage 101 to keep the evacuation section and the inside of the processing chamber 23 in communication with each other. The evacuation section operates to evacuate, through the evacuation port 26, particles in the processing chamber 23 such as reaction products generated during processing of the processing gas 25, plasma, and sample 4 introduced into the processing chamber 23.

A turbo-molecular pump 28, a type of vacuum pump, is disposed below the evacuation port 26 with a pressure regulating valve 27 between the evacuation port 26 and the turbo-molecular pump 28. The pressure in the processing chamber 23 is regulated to a pressure (in the present example, approximately several Pa) suitable for processing by adjusting the balance between the amount of the processing gas 25 flowing in through the gas introduction port and the amount of evacuation resulting from adjustment of the degree of opening of the pressure regulating valve 27 that rotates around an axis extending in a horizontal direction to traverse the evacuation port 26 or a channel coupling the evacuation port 26 and an inlet of the turbo-molecular pump 28 together, to increase and reduce the cross-sectional area of the channel.

The plasma forming section in the upper portion of the processing chamber 23 in the vacuum container 21 includes a waveguide 31 through which the microwave electric field propagates and a microwave oscillator 29 disposed at an end of the waveguide 31 and which oscillates to form a microwave electric field in the waveguide 31. Furthermore, the waveguide 31 is connected at the other end thereof to an upper portion of a cylindrical space positioned above the window member 22.

The microwave electric field 30 generated by the microwave oscillator 29 is introduced into the cylindrical space from above through the waveguide 31. Inside the space, the microwave electric field is resonated and increased at a particular mode. In this state, the microwave electric field 30 is introduced into the processing chamber 23 from above through the window member 22.

Furthermore, above the processing chamber 23 in the vacuum container 21 and horizontally around the processing chamber 23 and the waveguide 31, a plurality of solenoid coils 32 are disposed so as to enclose the processing chamber 23. DC power is applied to the solenoid coil 32 to form a magnetic field, which is supplied to the inside of the processing chamber 23. The magnetic field has been adjusted to a density or an intensity compatible with the frequency of the microwave electric field 30 so as to form ECR.

In the present embodiment, to allow control of the temperature of the sample 4, which is a semiconductor wafer, a refrigerant is passed through refrigerant channels 5 positioned inside the sample stage 101 to exchange heat between the refrigerant and the sample stage and thus between the refrigerant and the sample 4. A temperature control unit 34 is connected to the refrigerant channels 5 via a conduit through which the refrigerant flows. Thus, a path for the refrigerant is formed in which the refrigerant is circulated as follows: the refrigerant with the temperature thereof regulated to within a predetermined range of values by the temperature control unit 34 such as a chiller flows through the conduit into the refrigerant channels 5, and while the refrigerant is passing through the refrigerant channels 5, heat exchange takes place, and then, the refrigerant is discharged and returns to the temperature control unit through the conduit.

Furthermore, an electrode block that is a metallic cylinder- or disk-shaped base material is disposed inside the sample stage 101. The base material has the refrigerant channels 5 inside and is electrically connected to a high-frequency (radio frequency) power supply 20 that supplies high-frequency power. Additionally, an upper surface of the sample stage 101 provides a circular flat surface on which the sample 4 is loaded, has a recessed portion in which a cover enclosing an outer periphery of the circular upper surface to cover and protect the sample stage 101 from plasma 33 is disposed.

Another vacuum container (not depicted in the drawings) is connected to a sidewall of the vacuum container 21 in the plasma processing apparatus configured as described above. A gate that is a passage through which the wafer is conveyed allows communication between the vacuum container 21 and a vacuum conveying chamber which is a conveying space positioned inside the another vacuum container and in which a conveying robot is disposed. The unprocessed sample 4 is held on a telescopic arm of the robot in the vacuum conveying chamber. With a gate valve (not depicted in the drawings) open which opens or air-tightly closes the gate for communication between the vacuum container 21 and the vacuum conveying chamber, the wafer is carried from the vacuum conveying chamber into the processing chamber 23, delivered to the sample stage 101, and loaded onto the upper surface of the loading surface.

The sample 4 loaded on the loading surface in contact therewith is electrostatically attracted onto the loading surface by the electrostatic force of charges generated in a dielectric member providing the loading surface, by power supplied to an electrostatic chuck (not depicted in the drawings). In this state, gas for transfer of thermal He or the like is fed to between a back surface of the sample 4 and the loading surface to promote heat exchange between the sample 4 and the dielectric material in the loading surface and thus between the sample 4 and the sample stage 101.

The processing gas 25 is fed into the processing chamber 23 from above through the gas introduction hole. The turbo-molecular pump 28 and the pressure regulating valve 27 operate to discharge gas or particles in the processing chamber 23 to the outside of the processing chamber 23 through the evacuation port 26. The pressure inside the processing chamber 23 is regulated to within a desired range of values suitable for processing based on the balance between the amount of the processing gas 25 introduced per unit time and the amount of particles evacuated through the evacuation port 26 (evacuation speed).

In this state, the processing chamber 23 is internally supplied with the microwave electric field passed through the waveguide 31 and the window member 22 and the magnetic field generated by the solenoid coil 32. ECR is formed by the interaction between the microwave electric field 30 and the magnetic field from the solenoid coil 32. The ECR is then used to excite the particles of the processing gas 25 to form the plasma 33 in the space above the sample stage 101 in the processing chamber 23. A film that is a processing target is disposed on the upper surface of the sample 4 held on the loading surface of the sample stage 101. The film is etched by the interaction between charged particles in the plasma 33 and excited active particles. In the present embodiment, the circuit is provided through which the refrigerant with the temperature thereof regulated during processing is circulated and fed to the inside of the sample stage 101. This allows the temperature of the sample stage 101 and thus of the sample 4 to be regulated to within the range of values suitable for processing.

When a detector (not depicted in the drawings) that determines an end point of processing detects that the end point of processing has been reached, the processing is stopped to stop the supply of the electric field and the magnetic field, thus quenching the plasma 33. The gate valve is opened to extend the arm of the conveying robot, which enters the inside of the processing chamber 23 and receives the sample 4 thereon from the position on the sample stage 101. Then, the arm is contracted to carry the sample 4 out from the processing chamber 23. Thereafter, another unprocessed sample 4 is carried into the processing chamber 23.

Now, a detailed configuration of the sample stage 101 according to the present embodiment will be described using FIG. 2. FIG. 2 is an enlarged vertical cross-sectional view schematically depicting the configuration of the sample stage depicted in FIG. 1.

In the present embodiment, in the sample stage 101, a film- or sheet-like member formed of a dielectric material and providing an electrostatic attraction function is disposed on an upper surface of the electrode block 1 that is a metallic cylinder- or disk-shaped member in which the refrigerant channels 5, that is, the paths through which a heat exchange medium (hereinafter referred to as the refrigerant) flows are positioned. A material for the dielectric may be ceramic such as alumina or yttria.

In the present embodiment, the dielectric film 2 will be described. The dielectric film 2 is formed by thermal spraying in which particles of the ceramic are sprayed onto the upper surface of the electrode block 1 up to a predetermined thickness, the ceramic having been brought into a semi-molten state by increasing the temperature using plasma at the atmospheric pressure. Furthermore, when a sheet-like member is used as a dielectric member, a sintered plate may be used which is formed by burning, at a high temperature, a member with a predetermined sheet shape into which the ceramic is formed.

One or more film-like electrodes (not depicted in the drawings) that allow the sample 4 to be electrostatically attracted are disposed inside the dielectric film 2 to provide an electrostatic chuck. A DC voltage is applied to the internal electrodes to generate intended polarities to accumulate charges on an inner side of the upper surface of the dielectric film 2, generating static electricity. The sample 4 loaded on the upper surface is thus attracted and held on the loading surface of the sample 4, which corresponds to and is formed of the upper surface of the dielectric film 2.

The electrode block which is the base material of the sample stage 101, internally has refrigerant channels 5, a plurality of pushup pins 6 with the sample 4 loaded on the tips thereof, the pushup pins 6 moving up and down to move the sample 4 up and down above the loading surface for the sample, through-holes in which the pushup pins 6 are disposed, bellows 7 that surround peripheries of lower portions of the respective pushup pins 6 below the electrode block 1 or the through-holes to separate the inside of the bellows 7 from the outside of the bellows 7 in an air-tight manner, and a pushup pin elevating and lowering mechanism 8 connected to lower ends of the pushup pins 6 to move the pushup pins 6 up and down and to extend and contract the bellows 7 along folds of the bellows 7. Moreover, a heat transfer gas channel 11 that is a feeding path for thermoconductive gas such as He gas which promotes heat transfer between the sample 4 and the sample stage 101 is positioned so as to penetrate the electrode block 1, the heat transfer gas channel 11 being in communication with an opening in the upper surface of the dielectric film 2 through which the thermoconductive gas is introduced into a gap formed between the back surface of the sample 4 and the loading surface, which is the upper surface of the dielectric film 2, while the sample 4 is loaded on the loading surface.

Each of the pushup pin 6 is housed inside the through-hole in the electrode block 1 while the sample 4 is held on the upper surface of the dielectric film 2 in the sample stage 101. When the sample 4 is carried out from the processing chamber 23 or another sample is loaded onto the sample stage 101, the pushup pin 6 moves up to project the tip up above the loading surface of the dielectric film 2. A lower end of the pushup pin 6 is coupled to abase member 6' and connected to the pushup pin elevating and lowering mechanism 8 connected to the base member 6'.

An opening through which He gas is fed or evacuated is positioned on an inner side of the bellows 7 corresponding to an upper surface of the base member 6'. The opening and the heat transfer gas channel 11 are connected to and communicate with the feeding and evacuation conduit 19 for He gas via a connection path 18. In the present embodiment, an He gas feeding port 17 which is an opening in the upper surface of the dielectric film 2 and which is located over and communicates with the heat transfer gas channel 11 is in communication via the connection path 18 with an opening which is an evacuation path 16 opening in the upper surface of the dielectric film 2 and which communicates with the corresponding through-hole with the pushup pin 6 housed therein, via a gap (hereinafter referred to as an He filling gap) formed between the back surface of the sample 4 and the upper surface of the dielectric film 2 while the sample 4 is loaded on the upper surface of the dielectric film 2.

The feeding and evacuation conduit 19 according to the present embodiment is a path through which He gas flows and includes a plurality of pipes branching from the feeding and evacuation conduit 19 or connected to the feeding and evacuation conduit 19 via bypass conduits, and valves disposed on the pipes to release and interrupt (open and close) a flow of He gas or to regulate the flow rate and velocity of the gas. The feeding and evacuation conduit 19 is in communication, at one end thereof, with the inside of the bellows 7 for the sample stage 101 and with the heat transfer gas channel 11. Moreover, the feeding and evacuation conduit 19 includes two conduits for supply and evacuation of He gas at the other end thereof. The two conduits are connected to a storage tank that is a gas source (not depicted in the drawings) and which is set at a high pressure and an evacuation pump such as a rotary pump which is configured to evacuate gas from the inside of the conduit 19, respectively.

The feeding and evacuation conduit 19 according to the present embodiment includes an He feeding line providing a path which is connected to and communicates with the heat transfer gas channel 11, the through-hole in the electrode block 1, at a sample stage-101-side end of the He feeding line so that He gas from the gas source flows through the conduit into the He filling gap between the sample 4 and the dielectric film 2 via the heat transfer gas channel 11 and a corresponding He gas feeding port 17 in the upper surface of the dielectric film 2. The feeding and evacuation conduit 19 according to the present embodiment also includes an He evacuation line providing a path which is connected to the base member 6' inside the bellows 7 at another sample stage-101-side of the path to communicate with an opening positioned in an upper surface of the base member 6', thus evacuating the He gas present in the He filling space or in a space 7' inside the bellows 7.

Moreover, the He feeding line and the He evacuation line are configured such that, outside the sample stage 101, one of the lines branches and couples to the other line or the two lines are connected together via a bypass conduit 50, to provide a path through which He gas is fed and evacuated and which is in communication with the inside of the space 7' defined by the bellows 7 and the through-hole. In other words, the feeding and evacuation conduit 19 includes the two lines connected to and communicating with each other through the He filling gap in the upper portion of the sample stage 101 and the bypass conduit 50 in the lower portion of the sample stage 101.

Figure 2:
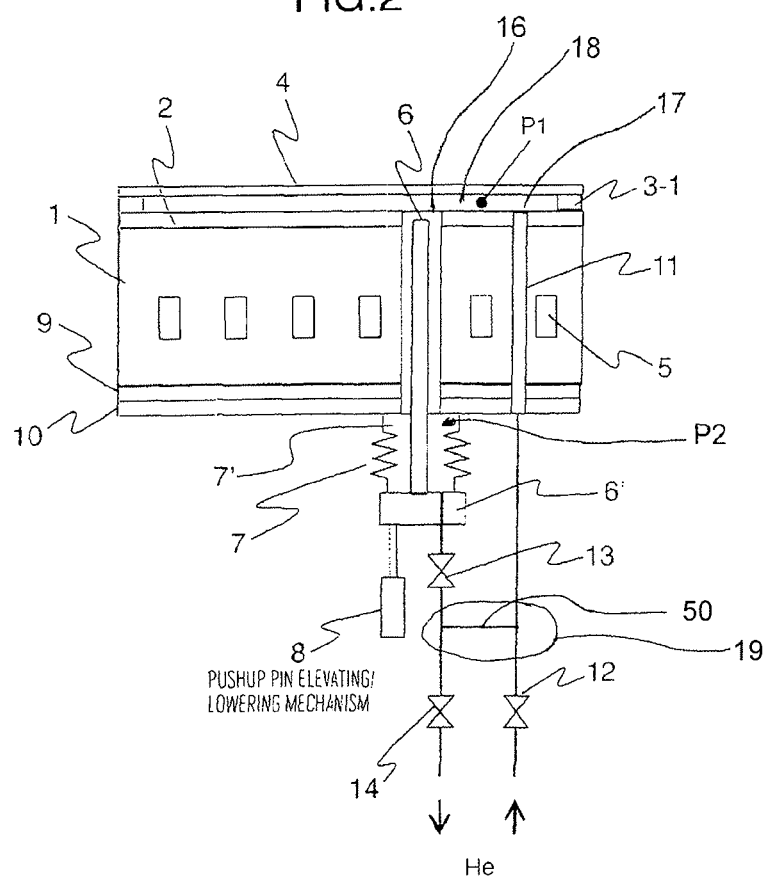
FIG. 2 is an enlarged vertical cross-sectional view schematically depicting a configuration of a sample stage in the embodiment depicted in FIG. 1.

In the feeding and evacuation conduit 19 according to the embodiment depicted in FIG. 2, a bellows evacuation valve 13 that opens and closes the He evacuation line is disposed on the He evacuation line communicating with the opening in the upper surface of the base member 6', which faces the space 7', and on an upstream side (on a side closer to the opening in the base member 6') of a branching portion branching to the He feeding line communicating with the heat transfer gas channel 11 or of a coupling portion coupled to the bypass conduit 50 connecting the two paths. Moreover, an He evacuation valve 14 that increases and reduces the flow rate of He gas discharged by the evacuation pump or opens and closes the path is installed at a predetermined position on a downstream side (on a side closer to the evacuation pump) of the coupling portion coupled to the bypass conduit 50. Furthermore, an He feeding valve 12 that increases and reduces the flow rate of He gas fed from the gas source or opens and closes the He feeding line is installed at a predetermined position on the He feeding line connected to the heat transfer gas channel 11 and on an upstream side (on a side closer to the gas source) of the coupling portion coupled to the bypass conduit 50.

An outer peripheral seal 3-1 that is a protruding portion arranged like a ring and protruding upward is disposed on an upper surface of an outer peripheral edge of the dielectric film 2. The outer peripheral seal 3-1 is a member formed of the same material as that of the dielectric film 2 and having a rectangular or trapezoidal vertical cross section. When other portions are thermally sprayed or coated on the upper surface of the electrode block 1 or formed on the upper surface as a sintered material, the outer peripheral seal 3-1 is formed integrally with the dielectric film 2 as a part thereof. The sample 4 in the present embodiment is placed on a plurality of fine projections (not depicted in the drawings) preformed on a front surface of the dielectric film 2 and on an upper surface of the outer peripheral seal 3-1. The sample 4 is thus loaded on the dielectric film 2 so as to be supported by contact with the fine projections and the upper surface of the outer peripheral seal 3-1.

In this state, very small gaps are formed between the back surface of the sample 4 and recesses between the fine projections on the surface of the dielectric film 2. Thus, He gas introduced through an He feeding port positioned at an upper end of the heat transfer gas channel 11 diffuses upon filling the through-holes, promoting heat transfer between the sample 4 and the dielectric film 2. This allows heat transfer to be performed between the sample 4 and the electrode block 1 even when the processing chamber 23 is internally at a high vacuum pressure suitable for processing using plasma.

The sample 4 is attracted and held on the dielectric film 2 using an electrostatic force exerted by charges accumulated on the upper surface of the dielectric film 2 by applying a DC voltage to a metallic film-like electrode pre-disposed inside the dielectric film 2. With the sample 4 attracted to the dielectric film 2 by the electrostatic force, the outermost peripheral edge of back surface of the sample 4 is pressed, under a high pressure, against at least a central side of the upper surface of the outer peripheral seal 3-1 which is flattened and having lower surface roughness than the upper surface of the dielectric film 2. Thus, the outer peripheral seal 3-1 encloses and separates the gap (He filling gap)

between the sample 4 and the dielectric film 2 from the outside. He gas fed into the He filling gap through the He gas feeding port is from endlessly leaking into the processing chamber 23 through the outer peripheral edge of the dielectric film 2.

In the configuration in which the feeding and evacuation conduit 19 is connected to the sample stage 101 according to the present embodiment, the conductance of He gas (the easiness with which He gas flows) in the He filling gap between the He gas feeding port at the top of the heat transfer gas channel 11 and the opening at the top of each through-hole with the pushup pin 6 housed therein is set lower than the conductance in the space 7' in the through-hole with the pushup pin 6 housed therein and in an area from the space 7' to the coupling portion of the He evacuation line coupled to the bypass conduit 50, the conductance in the heat transfer gas channel 11 and in an area from the heat transfer gas channel 11 to the coupling portion coupled to the bypass conduit 50 of the He evacuation line, and the conductance in each bypass conduit 50.

Before and during processing of the sample 4, the refrigerant with the temperature thereof regulated to within a predetermined range of values by the temperature control unit 34 is fed and circulated through the refrigerant channels 5. Thus, the electrode block 1 and thus the sample 4 are adjusted to the desired temperature suitable for processing. The metallic electrode block 1 is the base material of the sample stage 101 and is electrically connected to the high-frequency power supply 20 and supplied with high frequency power during processing of the sample 4.

In the sample stage 101 described above, with the sample 4 loaded on the dielectric film 2, the pushup pin elevating and lowering mechanism 8 configured using an actuator such as a fluid or a motor operates to move the pushup pins 6 up. The tips of the pushup pins 6 first come into contact with the back surface of the sample 4. Subsequently, the pushup pin 6 further moves up to separate the sample 4 from the loading surface of the dielectric film 2 and lift the sample 4 up to a predetermined height. Then, the pushup pin elevating and lowering mechanism 8 stops operation and is held on the tips of the pushup pins 6 at the height.

Another vacuum container (not depicted in the drawings) is connected to a sidewall of the vacuum container 21 in the plasma processing apparatus in FIG. 1. A space in the another vacuum container serves as a vacuum conveying chamber in which a vacuum conveying robot disposed in the space to convey the sample 4 is provided to covey the sample 4. With the vacuum conveying robot in the vacuum conveying chamber holding the unprocessed sample 4 on a holding section at a tip portion of one of a plurality of arms of the robot, the gate valve opening and closing the gate operates to open the gate that is a passage which keeps the processing chamber 23 in the vacuum container and the vacuum conveying chamber in communication with each other and through which the sample 4 is conveyed. Then, the other arm with no sample 4 loaded thereon extends through the gate to carry the sample 4 into the processing chamber 23.

The arm tip portion enters the gap between the back surface of the sample 4 and the front surface of the dielectric film 2 which gap is formed while the pushup pins 6 are lifting and holding the sample 4. The empty holding section with no sample 4 loaded thereon is placed below the sample 4. Subsequently, the pushup pin elevating and lowering mechanism 8 operates to move the pushup pins 6 down, loads the sample 4 on the holding section, and further lowers. In this state, the arm with the sample 4 loaded on the holding section contracts to carry the sample 4 into the vacuum conveying chamber outside the processing chamber 23.

Then, the arm with the unprocessed sample 4 loaded thereon extends to carry the sample 4 into the processing chamber 23 through the gate, and stops after positioning the sample 4 held on the holding section above the openings of the through-holes with the plurality of pushup pins housed therein, the openings being formed in the upper surface of the dielectric film 2 providing the loading surface of the sample stage 101. In this state, the pushup pin elevating and lowering mechanism 8 operates to move the pushup pins 6 up to bring the tips of the pushup pins 6 into contact with the back surface of the unprocessed sample 4 loaded on the holding section of the arm. Thereafter, the pushup pin elevating and lowering mechanism 8 further moves up to lift the sample 4 further up above the holding section of the arm. The pushup pin elevating and lowering mechanism 8 then stops and holds the sample 4 above and away from the arm.

When another unprocessed sample 4 is loaded and held on the tips of the pushup pins 6, the arm contracts to move out from the processing chamber 23 to the vacuum conveying chamber. The gate valve closes the gate in an air-tight manner to seal the processing chamber 23. In this state, the pushup pin elevating and lowering mechanism 8 operates to cause the pushup pins 6 to start moving down to move the sample 4 down. Even after each of the pushup pins 6 is housed up to the tip thereof in the through-hole and the back surface of the sample 4 comes into contact with the fine projections on the upper surface of the dielectric film 2 or with the upper surface of the outer peripheral seal 3-1, the operation of the pushup pin elevating and lowering mechanism 8 continues. The pushup pin elevating and lowering mechanism 8 lowers down to the position where the pushup pin 6 is housed and then stops. Subsequently, DC power is supplied to the electrode in the dielectric film 2 to cause the sample 4 to be electrostatically attracted to the dielectric film 2. He gas is fed to the He filling gap through the heat transfer gas channel 11.

In the present embodiment, a plurality of (for example, three or more) pushup pins 6 are preferably provided in order to stably hold the sample 4. At least a particular plural number (for example, three) of these pushup pins 6 are disposed on the upper surface of the circular loading surface of the dielectric film 2 and housed inside the through-holes communicating with the openings positioned around the center of the loading surface so as to be separated from one another at a predetermined distance from the center. The openings or the through-holes are positioned around and at a predetermined distance from the center of the loading surface where the openings or the through-holes are separated from one another. However, the above-described arrangement for electrostatic attraction fails to be disposed inside the through-hole or opening in which each of the pushup pins 6 is disposed. Thus, at the position where the pin is disposed, the electrostatic attraction function fails to be provided in the loading surface.

At such a position where each of the pushup pins 6 is disposed, the performance of heat transfer between the sample stage 101 and the sample 4 is degraded. Thus, the temperatures at the positions on the upper surface of the sample 4 located above and corresponding to the position where the pushup pin 6 is disposed may not only differ significantly from the temperatures of the surroundings but also become singularities on a temperature distribution which are difficult to regulate to a desired value. To solve this problem, the present embodiment covers the lower portion of the pushup pin 6 and the periphery of the through-hole with the telescopic and vacuum sealable bellows 7 to enable the through-hole to be internally filled with He gas.

The bellows 7 extends and contracts to operate the pushup pin elevating and lowering mechanism 8 to elevate and lower the pushup pin 6. In conjunction with this, the bellows 7 extends and contracts to increase and reduce the distance between the base member 6' and a lower surface of the electrode block 1 to separate the inside of the space 7' inside the bellows 7 from the outside in an air-tight manner. Thus, the pressure of the He gas with which the space 7' is internally filled is kept within a predetermined range of values.

On the lower surface of the electrode block 1, a grounding electrode 10 is disposed which is an electrode covering the lower surface of the electrode block 1 to provide an insulator member 9 and a ground potential. Thus, even when a high frequency voltage from the high-frequency power supply 20 is applied to the electrode block 1, the pushup pin elevating and lowering mechanism 8, valves described below, and the like are restrained from malfunctioning due to electromagnetic waves leaking to the pushup pin elevating and lowering mechanism 8, the valves, and the like.

Furthermore, in the feeding and evacuation conduit for He gas connected to and communicating with the heat transfer gas channel 11 penetrating the electrode block 1, the He feeding valve 12 is "opened" to allow He gas from the gas source to flow into the heat transfer gas channel 11 regardless of whether the bellows evacuation valve 13 and the He evacuation valve 14 are open or closed. The He gas is fed to the He filling gap via the heat transfer gas channel 11.

In the present embodiment, when He gas is fed to the He filling gap, particles of the He gas having diffused through the He filling gap flows into the through-hole positioned in the front surface of the dielectric film 2 and in which the pushup pin 6 is housed. The particles then diffuse into the space 7'. As a result, the pressure in the He filling gap is equivalent to the pressure in the space 7' with the pushup pins 6 housed therein. In the present embodiment, when the pressure in the He filling gap is equal to the pressure in the space 7', the feeding of He gas though the feeding and evacuation conduit is stopped to prevent the pressure in the space 7' or in the He filling gap from further increasing. However, the present embodiment is not limited to this configuration, but the pressure in the feeding and evacuation conduit may be increased to increase the pressure of the gas in the He filling gap to further enhance the heat transfer through the gap.

Thus, the pressure of the He gas in the space 7 is set equivalent to the pressure in the He filling gap to restrain the space 7' from providing a singularity in the temperature distribution of the sample 4. However, in the configuration using the bellows 7, the volume in the space 7' is larger than the volume of the He filling gap under the back surface of the sample 4.

Thus, a time needed to evacuate He gas from the space 7' is a dominant element for a time needed to evacuate He gas from the He filling gap and thus needed to separate the sample 4 from the upper surface of the dielectric film 2 or the outer peripheral seal 3-1 using the pushup pin 6 after the steps of plasma processing of the sample 4 end. In other words, the time needed to evacuate He gas significantly affects the number of samples 4 processed per unit time by the apparatus, that is, throughput. Consequently, the time for evacuation is desired to be reduced in order to increase throughput to improve the efficiency of processing.

In the present embodiment, the line is installed which enables He gas to be evacuated through the pushup pin 6 holes. Moreover, the bellows evacuation valve 13 is installed on the evacuation line. The bellows evacuation valve 13 is opened and closed to allow the He evacuation state in the pushup pin hole to be controlled. When the bellows evacuation valve 13 is opened, the He evacuation valve 14 is also opened. The He evacuation valve 14 and the He feeding valve 12 are not simultaneously opened. When one of these valves is open, the other is closed. When the apparatus is shut down, both valves are closed.

Operation performed when He gas is fed and evacuated will be described. In the present embodiment, when He gas is fed to the He filling gap or the space 7' in the through-hole or the bellows 7, first, the sample 4 is loaded, attracted, and held on the upper surface of the dielectric film 2, and the He feeding valve 12 is opened in accordance with a command signal from a control apparatus (not depicted in the drawings). Since the He feeding valve 12 is open, He gas is fed to the He filling gap through the heat transfer gas channel 11 and further to the space 7' inside the through-hole with the pushup pin 6 housed therein and inside the bellows 7.

At this time, the bellows evacuation valve 13 is kept closed. Thus, the communication between the He feeding line and He evacuation line providing the feeding and evacuation conduit, and thus between the He feeding line and the space 7' is interrupted, and the interruption is maintained.

The pressure P1 in the He filling gap is detected by the control apparatus, which has received an output signal from a pressure sensor (not depicted in the drawings). When the control apparatus determines that the pressure P1 is at a preset value or larger, processing (in the present embodiment, an etching process) of the sample 4 is started based on a command signal from the control apparatus. For example, when the control apparatus detects that, with the sample 4 attracted and held on the dielectric film 2, the He feeding valve 12 has been fully opened to allow He gas to be fed, so that the pressure P1 in the He filling gap is, for example, at 500 Pa or higher, then processing of the sample 4 is started by supplying the inside of the processing chamber 23 with the microwave electric field 30 and the electric field from the solenoid coil 32 to form the plasma 33 in the processing chamber 23 and supplying the electrode block 1 with high frequency power from the high-frequency power supply 20.

Then, when He gas is evacuated from the He filling gap if, for example, the end of processing of the sample 4 is detected, first, the He feeding valve 12 is closed in accordance with a command signal from the control apparatus. Thus, the communication between the feeding and evacuation conduit for He gas and the gas source is interrupted at a position on an upstream side of the coupling portion coupled to the bypass conduit 50.

Then, the bellows evacuation valve 13 and the He evacuation valve 14 are fully opened, and this state is maintained. This operation keeps one path included in the feeding and evacuation conduit 19 which is connected to the base member 6' in communication with the space 7' in the bellows 7, the inside of the through-hole with the pushup pin 6 housed therein and the He filling gap defined by the space between the dielectric film 2 and the back surface of the sample 4, downstream sides of the coupling portions of the heat transfer gas channel 11 and of another path of the feeding and evacuation conduit 19 which is connected to and communicates with the heat transfer gas channel 11, the coupling portions being couples to the bypass conduit 50, and the bypass conduit 50. The path included in the feeding and evacuation conduit 19 is connected to the evacuation pump via the other end of the path in the feeding and evacuation conduit 19.

Thus, the evacuation pump operates to evacuate the He gas present in the space 7' and in the He filling space, through the opening in the upper surface of the base member 6'. Furthermore, the He gas in the He filling space and in the heat transfer gas channel 11 is evacuated through the bypass conduit 50 of the feeding and evacuation conduit 19. In this manner, the He gas in the He filling gap and in the through-hole is evacuated in parallel at a high speed through the two paths.

In this regard, when the sample 4 is a circular Si wafer with a diameter of 300 mm or with a diameter value that is approximate to 300 mm to the degree that the value may be considered to be equal to 300 mm, the weight of the wafer sets the push pressure in the He filling space to about 18 Pa. Thus, in the present embodiment, when the control apparatus determines that the pressure of the He gas in the He filling gap and in the through-hole detected using the pressure sensor has decreased below 18 Pa, the supply of an electrostatic attraction voltage to the electrode in the dielectric film 2 is stopped in accordance with a command from the control apparatus. Moreover, a static elimination operation is performed in which charges accumulated on the sample 4 are reduced or eliminated. Then, the pushup pins 6 are elevated.

In this regard, if the supply of the electrostatic attraction voltage is stopped when the pressure in the He filling space is at 18 Pa or higher, the sample 4 (wafer) may float and be displaced due to the pressure of He gas on the back surface. In the present embodiment, during feeding and evacuation of He gas, He gas flows through the He filling gap and the space 7' in the through-hole with the pushup pin 6 housed therein, in that order. This restrains the He gas inside the bellows 7 from flowing toward the He filling gap to cause foreign matter in the through hole or the space 7' to fly toward the back surface of the sample 4.

Normally, as the number of wafers processed increases, an increasing amount of particulates inside the processing chamber 23, which may act as foreign matter, adhere to the inside of the processing chamber 23. In particular, particles flying into the through-hole with the pushup pin 6 housed therein are not exposed directly to plasma and are thus retained and accumulated inside the through-hole. When the particulates in the through-hole or fragments of deposit of the particulates fly up and adhere to the back surface of the sample 4 through the opening of the through-hole, the particulates or the fragments act as foreign matter of the sample 4 to diffuse throughout the etching apparatus via the hand of the conveying robot. When such foreign matter falls and adheres to the film on the front surface of the sample 4 or to the processed film structure, a semiconductor device including such a portion exhibits degraded performance, leading to a decrease in the productivity (yield) of semiconductor devices.

The above-described configuration of the present embodiment solves the above-described problems and is expected to produce the following effects.

(1) The flow rate and velocity of evacuation at the end of processing of the sample 4 (in the case of evacuation of He gas) can be increased.

(2) Possible singularities in the temperature of the front surface of the sample 4 can be reduced while the sample 4 is being processed (while heat transfer gas is being fed to the He filling gap).

(3) The processing chamber 23 is restrained from being contaminated by foreign matter flying from the through-hole openings with the pushup pins 6 housed therein.

Variation

A variation of the above-described embodiment will be described using FIG. 3, FIG. 4A, and FIG. 4B. FIG. 3 is a vertical cross-sectional view schematically depicting a main part of a configuration of a sample stage in a plasma processing apparatus according to a variation of the embodiment depicted in FIG. 1.

In FIG. 3, at the outer peripheral edge of the dielectric film 2 disposed to cover the upper surface of the cylindrical electrode block 1 in the sample stage 101, the ring-like outer peripheral seal 3-1 is disposed so as to project upward while enclosing the dielectric film 2. The outer peripheral seal 3-1 is a member formed of the same material as that of the dielectric film 2 and having a rectangular or trapezoidal vertical cross section. When other portions are thermally sprayed or coated on the upper surface of the electrode block 1 or formed on the upper surface as a sintered material, the outer peripheral seal 3-1 is formed integrally with the dielectric film 2 as a part thereof.

In the present variation, the height h1 of the outer peripheral seal 3-1 has a value between 10 μm and 100 μm which is constant in a circumferential direction of the dielectric film 2 or which is approximately constant to the degree that the height may be considered to be constant in the circumferential direction. Furthermore, the upper surface formed of the flat surface of the outer peripheral seal 3-1 has a width appropriate to keep the upper surface in abutting contact with the back surface of the sample 4 while the sample 4 is loaded, attracted, and held on the dielectric film 2, to allow air-tight separation of the space between the dielectric film 2 and the sample 4 located on the sample 4 central side of the abutting surface disposed like a ring along the outer peripheral edge of the back surface of the sample 4 from the space in the processing chamber 23 on the outer peripheral side of the sample 4 to the degree that a difference in pressure occurs between the spaces.

In the present variation, a dielectric pushup pin seal 3-2 is disposed like a ring surrounding the opening formed in the upper surface of the dielectric film 2 at the top of the through-hole with the pushup pin 6 housed therein. The pushup pin seal 3-2 is also a dielectric ring-like projection shaped to have a cross section similar to the cross section of the outer peripheral seal 3-1. The pushup pin seal 3-2 is formed integrally with the dielectric film 2 as a part thereof.

A configuration of the pushup pin seal 3-2 will be described in detail with reference to FIG. 4A and FIG. 4B. FIG. 4A and FIG. 4B are plan views schematically depicting the pushup pin seal depicted in FIG. 3 as viewed from axially above a through-hole.

Figure 4A:
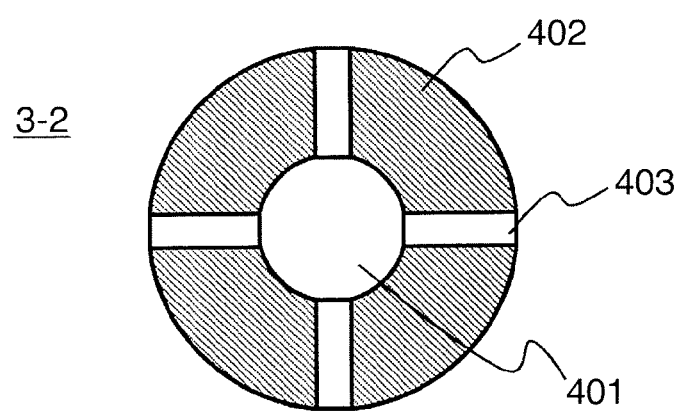
FIG. 4A and FIG. 4B are plan views schematically depicting a configuration of a pushup pin seal depicted in FIG. 3 as viewed from axially above a through-hole.

FIG. 4A depicts that the pushup pin seal 3-2 is disposed like a ring around a through-hole 401 in which the pushup pin 6 is housed. A ring-like flat upper surface of the pushup pin seal 3-2 is a portion providing a contact portion 402 that is in abutting contact with the back surface of the sample 4 while the sample 4 is attracted and held on the upper surface of the dielectric film 2. A plurality of groove portions 403 are formed in the upper surface radially around the axis of the through-hole to keep an inner peripheral side and an outer peripheral side of the ring in communication with each other.

The plurality of groove portions 403 are configured such that front surfaces of the groove portions 403 do not to contact the back surface of the sample 4 while the sample 4 is attracted and held on the upper surface of the dielectric film 2. On the other hand, the entire upper surface of the pushup pin seal 3-2 except for the groove portions 403 provides a contact portion 402 that contacts the back surface of the wafer. The present variation includes an arrangement that reduces the contact between the upper surface of the pushup pin seal 3-2 and the back surface of the sample 4 as described above.

The pushup pin seal 3-2 with the contact portions 402 and the groove portions 403 as described above separates the space 7' inside the through-hole 401 from the He filling gap outside the through-hole 401 in a semi-air-tight manner to the degree that a difference in pressure occurs between the space 7' and the He filling gap, while the sample 4 is attracted and held. That is, the space 7' inside the through-hole 401 and the He filling gap outside the through-hole 401 are kept in communication with each other by the plurality of groove portions 403, which provide a conductance sufficiently lower than the conductance of He gas retained in the He filling gap.

Figure 4B:
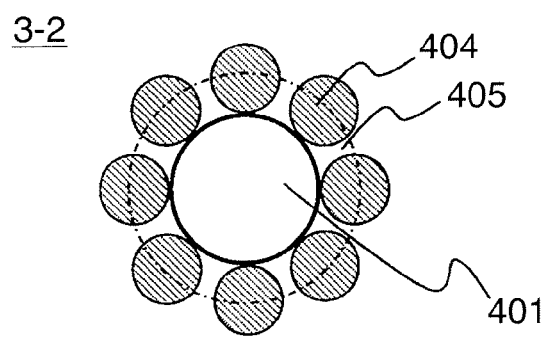

In FIG. 4B, instead of the combination of the ring-like flat contact portions and the radial groove portions in FIG. 4A, a plurality of cylindrical protruding portions each having a circular upper surface to serve as a contact portion 404 that comes into abutting contact with the back surface of the sample 4 is disposed around the opening of the through-hole 401 so that the centers of the circles of the upper surfaces of the protruding portions are positioned at even angles around the axis of the through-hole 401. Gaps 405 formed between the protruding portions along a circumferential direction of the through-hole 401 form spaces through which He gas flows between the back surface of the sample 4 and the front surface of the pushup pin seal 3-2 while the sample 4 is loaded and held on the dielectric film 2.

Moreover, as is the case with FIG. 4A, the space 7' inside the through-hole 401 and the He filling gap outside the through-hole 401 are kept in communication with each other so as to provide a conductance sufficiently lower than the conductance of He gas retained in the He filling gap. In the present variation, the conductance in the groove portions 403 and the gaps 405 is set higher than the conductance obtained when He gas flows from the He filling gap to the processing chamber 23 through the outer peripheral seal 3-1.

This configuration sets the conductance of the He gas in the He filling gap lower than the conductance in the space in the through-hole with the pushup pin 6 housed therein, the conductance in the heat transfer gas channel 11, and the conductance in each bypass conduit 50. Also in the present variation, in the configuration in which the feeding and evacuation conduit 19 is connected to the sample stage 101, the conductance of the He gas in the He filling gap between the He gas feeding port at the top of the heat transfer gas channel 11 and the opening at the top of the through-hole with the pushup pin 6 housed therein is set lower than the conductance in the space 7' in the through-hole with the pushup pin 6 housed therein and in an area from the space 7' to the coupling portion of the He evacuation line coupled to the bypass conduit 50, the conductance in the heat transfer gas channel 11 and in an area from the heat transfer gas channel 11 to the coupling portion coupled to the bypass conduit 50 of the He evacuation line, and the conductance in each bypass conduit 50.

Provision of the configuration of the present variation is expected to produce the following effects.

(1) The front surface of the dielectric film 2 with the temperature thereof regulated to within the desired range of values is located closer to the back surface of the sample 4. This improves local heat transfer between the sample 4 and the dielectric film 2. The opening of the through-hole 401 with the pushup pin 6 housed therein exerts only a weak electrostatic force or no electrostatic force in the upper surface of the dielectric film 2. Thus, in the related art, the corresponding position may act as a heat transfer singularity and thus as a singularity on the distribution of the temperature of the sample 4. In the present variation, the pushup pin seal 3-2 depicted in FIG. 4A and FIG. 4B is provided to enable improvement of local heat transfer around the opening of the through-hole 401 and a reduction in possible singularities on the temperature distribution or in the deviation of the temperature.

(2) A main factor for foreign matter generated in the through-hole 401 is considered to be a flow of He gas from the space 7' in the through-hole 401 toward the sample 4. However, even without such a flow, particulates or fragments of deposit may fly from the inside of the through-hole 401 toward the sample 4 due to an electrostatic force or the like. Even in such a case, since the pushup pin seal 3-2 defines the space between the back surface of the sample 4 and the upper surface of the dielectric film 2, the particulates or fragments are restrained from flying over a wide range of the back surface of the sample 4. At least particulates or fragments each with a size larger than the size of the groove portion 403 or the gap 405 depicted in FIG. 4A or 4B, respectively, fail to pass through the groove portion 403 or the gap 405. This prevents such particulates or fragments from flying from the space 7' inside the through-hole 401 to the Ile filling gap.

On the other hand, compared to the embodiment in FIG. 1, the present variation, which includes the pushup pin seal 3-2, reduces the flow rate or velocity of the flow of He gas flowing from the He filling gap into the through-hole 401. Thus, the present variation may need a longer time to feed He gas to the He filling gap to set the pressure of the He gas to a value within a range suitable for processing than the embodiment in FIG. 1.

Feeding of He gas to the back surface of the sample 4 (He filling gap) through the heat transfer gas channel 11 is performed in parallel with another operation during a non-processing time when, for example, the pressure in the processing chamber 23 is regulated before processing of the sample 4 is started. In the present variation, the sizes of the groove portion 403 and the gap 405, which are non-contact portions of the pushup pin seal 3-2, are set to prevent the time needed for feeding of He gas from affecting the throughput of the plasma processing apparatus.

Furthermore, the contact between the upper surface of the pushup pin seal 3-2 and the back surface of the sample 4 may be reduced by shaping the pushup pin seal 3-2 like a ring without the groove portions 403 or the gaps 405 and further setting the height h2 of the pushup pin seal 3-2 smaller than the height h1 of the outer peripheral seal 3-1. In this case, the ring-like gap between the back surface of the sample 4 and the upper surface of the pushup pin seal 3-2 with a height corresponding to the difference in height h1−h2 may be formed into the groove portions 403 or the gaps 405 in FIG. 4A or FIG. 4B, respectively. Moreover, the pushup pin seal 3-2 may be provided which has an upper surface with appropriate surface roughness instead of the plurality of cylindrical protruding portions in the example in FIG. 4B so that the tips of recesses and protrusions contact the back surface of the sample 4.

Figure 5:
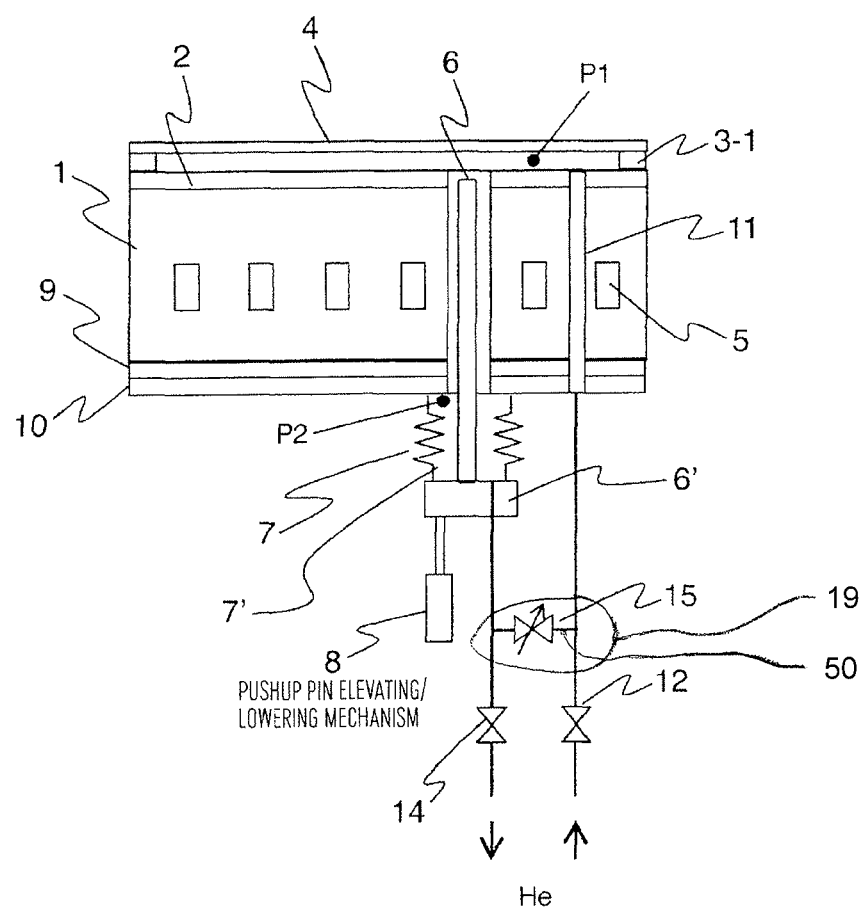
FIG. 5 is a vertical cross-sectional view schematically depicting a configuration of a main part of a sample stage in a plasma processing apparatus according to another variation of the embodiment depicted in FIG. 1.

Now, another variation of the above-described embodiment will be described using FIG. 5. FIG. 5 is a vertical cross-sectional view schematically depicting a configuration of a main part of a sample stage in a plasma processing apparatus according to another variation of the embodiment depicted in FIG. 1.

In the present variation, in contrast to the configuration of the feeding and evacuation conduit 19 for He gas depicted in FIG. 2, a flow rate control valve 15 is disposed on the bypass conduit 50 between the path (He feeding line) connected to the gas source and to the heat transfer gas channel and through which He gas flows toward the sample stage 101 and the path (He evacuation line) connected to the evacuation pump and to the opening in the upper surface of the base member 6' under the bellows 7 and through which He gas flows from the sample stage 101 toward the evacuation pump. Furthermore, the bellows evacuation valve 13 is not provided which is, in the embodiment, disposed on the He evacuation line on the sample stage 101 side of the coupling portion between the bypass conduit 50 and the He evacuation line.

Moreover, in the present variation, the outer peripheral seal 3-1 depicted in FIG. 1, FIG. 3, FIG. 4A, and FIG. 4B is disposed at the outer peripheral edge of the dielectric film 2 along the circular peripheral edge. On the other hand, the pushup pin seal 3-2 disposed around the through-hole 401 is not disposed on the dielectric film 2.

In such a configuration, He gas can be fed to the He filling gap through both of the heat transfer gas channel 11 and the space 7' in the bellows 7 and can be evacuated through the heat transfer gas channel 11 and the space 7'. For example, as is the case with the embodiment depicted in FIG. 1 and FIG. 2, when He is fed to the He filling gap, the He feeding valve 12 is maintained in an open state, and the He evacuation valve 14 is maintained in a closed state.

Moreover, based on a command signal from the control apparatus, the flow rate control valve 15 on the bypass conduit 50 opened at a low degree of opening, and the conductance of He gas in the bypass conduit 50 is set lower than the conductance in the He feeding line. Furthermore, the conductance of He gas in the bypass conduit 50 is set higher than the conductance in the He filling gap between the He gas feeding port at the upper end of the heat transfer gas channel 11 and the opening of the through-hole with the pushup pin housed therein.

Also in the present variation, in the configuration in which the feeding and evacuation conduit 19 is connected to the sample stage 101, the conductance of the He gas in the He filling gap between the He gas feeding port at the top of the heat transfer gas channel 11 and the opening at the top of the through-hole with the pushup pin 6 housed therein is set lower than the conductance in the space 7' in the through-hole with the pushup pin 6 housed therein and in an area from the space 7' to the coupling portion of the He evacuation line coupled to the bypass conduit 50, the conductance in the heat transfer gas channel 11 and in an area from the heat transfer gas channel 11 to the coupling portion coupled to the bypass conduit 50 of the He evacuation line, and the conductance in each bypass conduit 50. Thus, even though the communication between the He feeding line and the He evacuation line and thus between the He feeding line and the space 7' is not interrupted, the passage of He gas is blocked.

In such a configuration, He gas flowing from the gas source into the He feeding line is fed at a high flow rate through the heat transfer gas channel 11 and the opening in the upper surface of the dielectric film 2 communicating with the heat transfer gas channel 11 and at a low flow rate through the He evacuation line, the space 7' in the bellows 7, and the opening of the through-hole in the upper surface of the dielectric film 2, which is in communication with the space 7'. As a result, when feeding of He gas is started, the value of the pressure P1 in the He filling gap and the value of the pressure P2 in the pushup pin hole are in a relation P1≥P2. A pressure condition is thus established under which He gas flows into the space 7' through the He filling gap or is biased in a direction in which the He gas flows into the space 7'. This restrains He gas or particulates or fragments of deposit contained in the He gas and acting as foreign matter from flowing into the He filling gap while He gas is being fed.

Figure 6:
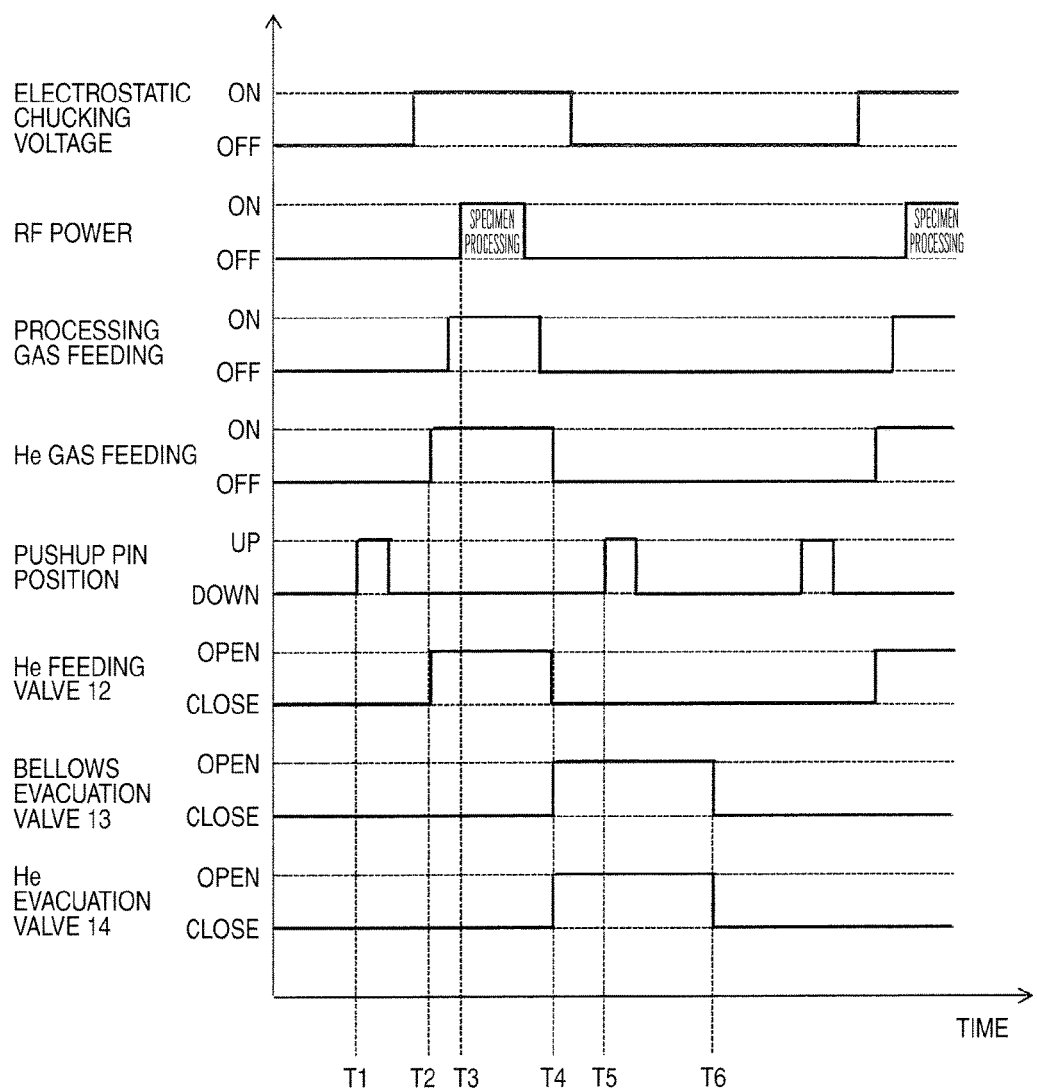
FIG. 6 is a time chart depicting a flow of operation of the plasma processing apparatus according to the embodiment depicted in FIG. 1.

Now a flow of operation of the plasma processing apparatus according to the above-described embodiment will be described using FIG. 6. FIG. 6 is a time chart depicting the flow of operation of the plasma processing apparatus according to the embodiment depicted in FIG. 1.

First, in the plasma processing apparatus depicted in FIG. 6, a process of etching any sample 4 is started. Then, in accordance with a command signal from the control apparatus (not depicted in the drawings), the sample 4 gripped by the hand at the tip of the conveying robot (not depicted in the drawings) is carried to above the dielectric film 2 providing the sample loading surface of the sample stage 101 in the processing chamber 23. The sample 4 is held in this state. Then, at a point in time T1, the pushup pin elevating and lowering mechanism 8 operates to lift up each pushup pin located inside the sample stage 101 with the tip of the pushup pin 6 housed in the through-hole no that the pushup pin moves up above the dielectric film 2.

As the pushup pins 6 continue rising, the tips of the plurality of pins come into contact with the back surface of the sample 4 held by the hand at the tip of the conveying robot. As the pushup pins 6 are further elevated, the sample 4 is supported, from below, above the hand by the plurality of pin tips. In this state, the pushup pins 6 stop. The conveying robot, separated from the sample 4, moves the tip with the hand out from the processing chamber 23.

Subsequently, each pushup pin 6 lowers down to the position where the tip of the pushup pin is housed inside the through-hole. The pushup pin 6 is completely housed in the through-hole with the sample 4 loaded on the front surface of the dielectric film 2 in the sample stage 101. In this state, an electrostatic attraction voltage is applied to the electrode inside the dielectric film 2 to provide the above-described electrostatic chuck, thus attracting and holding the sample 4 on the dielectric film 2.

In this state, at a point in time T2, feeding of He gas into the He filling gap is started. When He gas is fed, the He feeding valve 12 is set to and kept in the "open" state to allow He gas to be fed from the gas source to the He filling gap via the He feeding line through the heat transfer gas channel 11.

At this time, the pressure in the He filling gap and the through-hole with the pushup pin 6 housed therein measured before He gas is fed is equivalent to the pressure in the processing chamber 23 because the dielectric film 2, including the upper opening of the through-hole, is exposed to the processing chamber 23 before the sample 4 is loaded on the upper surface of the dielectric film 2. The pressure in the He filling gap and the through-hole has a smaller value than the pressure in the heat transfer gas channel 11, through which He gas flows. Moreover, the easiness (what is called conductance) with which He gas flows through the He filling gap sandwiched between the back surface of the sample 4 and the surfaces of fine recesses and protrusions on the upper surface of the dielectric film 2 is set lower than the conductance in the heat transfer gas channel 11 and the conductance in the through-hole with the pushup pin 6 housed therein.

In the configuration depicted in FIG. 2 and FIG. 3, while He gas is being fed from the heat transfer gas channel 11 to the He filling gap, the bellows evacuation valve 13 and the He evacuation valve 14 are closed and this state is maintained. In the configuration depicted in FIG. 5, the He evacuation valve 14 is closed and this state is maintained. Furthermore, the flow rate control valve 15 is kept open at a low degree of opening.

The He gas flows through the He feeding line toward the sample stage 101 and is fed to the He filling gap through the heat transfer gas channel 11. In the configuration in FIG. 2 and FIG. 3, all of the He gas from the gas source flows through the He feeding line and the heat transfer gas channel 11 into the He filling gap. Then, part of the He gas also flows into the space 7' in the bellows 7 through the opening of the through-hole with the pushup pin 6 housed therein. Furthermore, in the configuration in FIG. 5, the main part of the He gas from the gas source flows through the He feeding line and the heat transfer gas channel 11 into the He filling gap. The remaining part of the He gas flows through the bypass conduit 50 and the He evacuation line into the space 7'.

In all of FIGS. 2, 3, and 5, the pressure in the He filling gap is eventually equivalent to the pressure in the space 7'. However, during the initial period of the He gas feeding period (T2 to T4), the pressure P1 in the He filling gap and the pressure P2 inside the space 7' (including the space inside the through-hole) are in a relation P1≥P2. The final valve for the pressure of He on the back surface of the sample 4 (He filling gap) is set in accordance with the magnitude of the difference in pressure between the inside and outside of the He filling gap, which can be caused by the outer peripheral seal 3-1, from which at least a small amount of He gas leaks to the outside, and the pressure in the outside processing chamber 23. However, in the present variation, when the pressure sensor (not depicted in the drawings) detects in the He filling gap that a preset value has been reached, the He feeding valve 12 is closed to stop the feeding of the He gas.

More specifically, during the period when the sample 4 is attracted and held on the dielectric film 2 and when heat transfer gas needs to be fed, the He feeding valve 12 is closed if the pressure value for the He filling gap, which has been within the range of pressures suitable for processing, becomes larger than a preset threshold, and is opened to feed He gas to the He filling gap if the pressure value becomes smaller than the threshold. FIG. 6 does not depict intermittent opening and closing operations of the He feeding valve 12 and the corresponding intermittent operations of feeding He gas during the time T2 to T4 that is the period of He gas feeding during the period when the sample 4 is electrostatically attracted. FIG. 6 simply depicts a single turn-on operation and a single turn-off operation during this period.

In any of the above-described cases, while the He feeding valve 12 is open to allow He gas to be fed through the He feeding line, the pressure condition is established under which He gas flows into the space 7' through the He filling gap or is biased in a direction in which the He gas flows into the space 7'. This restrains He gas or particulates or fragments of deposit contained in the He gas and acting as foreign matter from flowing into the He filling gap while He gas is being fed.

Then, in accordance with a command signal from the control apparatus, processing gas is fed into the processing chamber 23, and the gas in the processing chamber 23 is evacuated through the evacuation port 26 by the operation of the evacuation pump. The control apparatus then detects that the pressure in the processing chamber 23 has been set to a value within the range suitable for processing based on the balance between the feeding and evacuation of the gas. Thereafter, in accordance with a command from the control apparatus, the processing gas is excited by the interaction between the microwave electric field 30 and the magnetic field from the solenoid coil 32. Thus, plasma is formed in the processing chamber 23.

At a point in time T3, high frequency power from the high-frequency power supply 20 is supplied to the electrode block 1 in the sample stage 101 to start a process of etching the sample 4. Subsequently, when the detector (not depicted in the drawings) detects the end point of etching, the supply of the high frequency power is stopped to stop the etching process in accordance with a command signal from the control apparatus.

Furthermore, when the feeding of the processing gas is stopped, the feeding of He gas is stopped at a point in time T4. That is, the He feeding valve 12 on the He feeding line is closed. Moreover, at the same time or at a point in time that is close to the same time to the degree that the point in time may be considered to be the same time, the He evacuation valve 14 is opened and this state is maintained. In the configuration in FIG. 2 and FIG. 3, the bellows evacuation valve 13 is also opened and this state is maintained.

The space 7' and He filling gap and the heat transfer gas channel 11 are brought into communication with the evacuation pump via the He feeding line. The He gas under the back surface of the sample 4 is evacuated both from the space 7' in the bellows 7 including the space in the through-hole and from the inside of the heat transfer gas channel 11. Evacuation is thus performed through the two paths in parallel, allowing the He gas in the He filling gap and in the space 7' to be evacuated at a high speed in a short time. Furthermore, in the example in FIG. 3 and FIG. 5, the arrangement that interrupts the flow of gas is disposed in the passage for He gas which keeps the He feeding line and the He evacuation line in communication with each other in the sample stage 101 and the feeding and evacuation conduit of He gas, reducing the relevant conductance. This restrains He gas or particulates or fragments of deposit contained in the He gas and acting as foreign matter from flowing into the He filling gap while He gas is being evacuated from the He filling gap.

The control apparatus detects that the He pressure on the back surface of the sample 4 has decreased below a preset value suitable for unloading of the sample 4. Then, in accordance with a command signal from the control apparatus, the supply of the electrostatic attraction voltage is stopped, and the static elimination step of eliminating or reducing the electrostatically chucking force is executed. Then, at a point in time T5, the pushup pins 6 are elevated. The elevation of the pushup pins 6 continues even after the back surface of the sample 4 comes into contact with the tips of the pushup pins 6. As a result, the sample 4 is lifted up and away from the dielectric film 2 and moves to a height position where delivery of the sample 4 is performed. Subsequently, the arm of the conveying robot (not depicted in the drawings) enters the inside of the processing chamber 23. The hand at the tip of the arm is inserted between the sample 4 and the dielectric film 2 and stopped.

The pushup pins 6 lower to move the sample 4 down to pass the sample 4 onto the hand. Each of the pushup pins 6 is then housed in the through-hole. The arm of the conveying robot contracts to carry the sample 4 out from the processing chamber 23. Subsequently, the bellows evacuation valve 13 and the He evacuation valve 14 are kept "open" until a point in time T6 before the next sample 4 is carried in. At the point in time T6, the bellows evacuation valve 13 and the He evacuation valve 14 are "closed".

Subsequently, when the next sample 4 is conveyed, the above-described operation is repeated to continue processing the sample 4. When the control apparatus detects that processing of a predetermined number of samples 4 has ended, the sample 4 is carried out. Then, maintenance work is performed on the inside of the processing chamber 23 or the pressure in the processing chamber 23 is released down to the atmospheric pressure.

In the above-described embodiment or variation, during feeding and evacuation of He gas, the operation as described above allows the flow of He gas to be directed from the He filling gap toward the inside of the through-hole (space 7'). This suppresses generation of foreign matter which may be caused by the flow of the He gas in the through-hole into the He filling gap. Thus, samples can be processed at a high throughput while a high yield is achieved in the manufacture of semiconductor devices.

The present invention is not limited to the configurations disclosed in the above-described embodiment or variation. Different forms may be provided without departing from the technical scope of the present invention. For example, the He feeding valve 12, bellows evacuation valve 13, He evacuation valve 14, flow rate control valve 15, and pushup pin seal 3-2 on the feeding and evacuation conduit disclosed in the embodiment and variation are not mutually exclusive. Both of the flow rate control valve 15 and the pushup pin seal 3-2 may be provided. Alternatively, all or some of the above-described valves and seal may be combined together so as to exert an effect that enables suppression of movement or diffusion of a substance acting as foreign matter from the space 7' to the He filling gap so that the valves and seal operate based on command signals from the control apparatus to exert the effect.

The sample stage in the semiconductor manufacturing apparatus proposed according to the present invention is not limited to the embodiment of the plasma processing apparatus but is also applicable to other apparatuses that need precise wafer temperature management, such as an ashing apparatus, a sputtering apparatus, an ion implantation apparatus, a resist coating apparatus, a plasma DVD apparatus, a flat panel display manufacturing apparatus, and a solar cell manufacturing apparatus.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus that uses plasma generated in a processing chamber in a vacuum container to process a sample electrostatically attracted onto a sample stage disposed in the processing chamber, the sample stage comprising:
   a plurality of pushup pins that move the sample up and down above the sample stage;
   a recessed and protruding dielectric film on which the sample is loaded;
   a feeding port disposed on the dielectric film and through which gas is fed to a gap between the sample and the dielectric film;
   a plurality of through-holes in each of which each of the plurality of pushup pins are housed, each of the plurality of through-holes having openings wherein each opening is disposed in an upper surface of the dielectric film;
   a plurality of bellows each of which is disposed below the sample stage and surrounding a lower portion of each of the pushup pins to separate an internal space including each of the pushup pins and the through-hole from an outside in an air-tight manner; and
   a feeding and evacuation conduit which is connected to the sample stage, the feeding and evacuation conduit comprising a feeding path, and an evacuation path and a bypass conduit, where the feeding path communicates with the feeding port for the gas and a gas source and through which the gas fed to the gap flows, wherein the evacuation path communicates with a space inside the bellows and through which the gas fed to the gap is discharged, wherein the feeding path and the evacuation path communicated through the gap which provides a connection path, and an upstream valve disposed on the evacuation path between the space inside the bellows and an intersection portion of the evacuation path and the bypass conduit which connects the evacuation path with the feeding path at a lower portion of the sample stage,
   wherein the plasma processing apparatus is configured to close the upstream valve such that communication between the feeding path and the evacuation path via the connection path is interrupted while the gas from the feeding path is fed to the gap and into the through-hole via the gap.

2. The plasma processing apparatus according to claim 1, further comprising a feeding valve which is disposed on the feeding path between the gas source and the intersection portion of the feeding path and the bypass conduit which connects the evacuation path with the feeding path at the lower portion of the sample stage, and the plasma processing apparatus is further configured to open the upstream valve and to close the feeding valve so that the feeding path and the evacuation path are in communication with each other via the connection path while the gas is in the gap and the space inside the bellows including the through-hole is evacuated through the evacuation path.

3. The plasma processing apparatus according to claim 1, wherein the dielectric film comprises a ring-like outer peripheral protruding portion that encloses an outer periphery of the gap and comes into abutting contact with a back surface of the sample and a ring-like protruding portion for the through-hole which encloses an outer periphery of the opening of the through-hole, and with the sample loaded on the dielectric film, a gap is formed between an upper surface of the protruding portion for the through-hole and the back surface of the sample.

4. The plasma processing apparatus according to claim 1, wherein, when the gas is evacuated, a pressure of the gas in the gap is set higher than a pressure of the gas in the through-hole.

5. A plasma processing apparatus that uses plasma generated in a processing chamber in a vacuum container to process a sample electrostatically attracted onto a sample stage disposed in the processing chamber,
   the sample stage comprising:
   a plurality of pushup pins that move the sample up and down above the sample stage;
   a recessed and protruding dielectric film on which the sample is located;

a feeding port disposed on the dielectric film and through which gas is fed to a gap between the sample and the dielectric film;

a plurality of through-holes in each of which each of the plurality of pushup pins are housed, each of the plurality of through-holes having openings wherein each opening is disposed in an upper surface of the dielectric film;

a plurality of bellows each of which is disposed below the sample stage and surrounding a lower portion of each of the pushup pins to separate an internal space including each of the pushup pins and the through-hole from an outside in an air-tight manner; and a feeding and evacuation conduit which is connected to the sample stage, the feeding and evacuation conduit comprising a feeding path, and an evacuation path and a bypass conduit wherein the feeding path communicates with the feeding port for the gas and a gas source and through which the gas fed to the gap flows, wherein the evacuation path communicates with a space inside the bellows and an evacuation unit and through which the gas fed to the gap is discharged, wherein the feeding path and the evacuation path communicates through the gap which provides a connection path, wherein the dielectric film further comprises a seal disposed on the connection path and a downstream valve disposed on the evacuation path between the evacuation unit and an intersection portion of the evacuation path and a bypass conduit which connects the evacuation path with the feeding path at a lower portion of the sample stage, wherein the plasma processing apparatus is configured to close the downstream valve such that communication between the feeding path and the evacuation path via the connection path is interrupted while the gas from the feeding path is fed to the gap and into the through-hole via the gap.

6. The plasma processing apparatus according to claim 5, further comprising a feeding valve which is disposed on the feeding path between the gas source and the intersection portion of the feeding path and the bypass conduit which connects the evacuation path with the feeding path at the lower portion of the sample stage, and the plasma processing apparatus is further configured open the downstream valve and to close the feeding valve so that the feeding path and the evacuation path are in communication with each other via the connection path while the gas is in the gap and the space inside the bellows including the through-hole is evacuated through the evacuation path.

7. The plasma processing apparatus according to claim 5, wherein the seal is a ring-like outer peripheral protruding portion of the dielectric film that encloses an outer periphery of the gap and comes into abutting contact with a back surface of the sample and includes another ring-like protruding portion of the dielectric film for the through-hole which encloses an outer periphery of the opening of the through-hole, and with the sample loaded on the dielectric film, a gap is formed between an upper surface of the protruding portion for the through-hole and the back surface of the sample.

8. The plasma processing apparatus according to claim 5, wherein, when the gas is evacuated, a pressure of the gas in the gap is set higher than a pressure of the gas in the through-hole.

* * * * *